(12) United States Patent
Fukushima et al.

(10) Patent No.: US 9,159,892 B2
(45) Date of Patent: Oct. 13, 2015

(54) LED LIGHT SOURCE DEVICE AND MANUFACTURING METHOD FOR THE SAME

(75) Inventors: Mizue Fukushima, Saitama (JP); Kenji Imazu, Saitama (JP); Hiroshi Tsukada, Saitama (JP); Ryo Tamura, Yamanashi (JP)

(73) Assignees: CITIZEN HOLDINGS CO., LTD., Tokyo (JP); CITIZEN ELECTRONICS CO., LTD., Yamanashi (JP)

(*) Notice: Subject to any disclaimer, the term of this patent is extended or adjusted under 35 U.S.C. 154(b) by 222 days.

(21) Appl. No.: 13/807,275

(22) PCT Filed: Jul. 1, 2011

(86) PCT No.: PCT/JP2011/065634
§ 371 (c)(1),
(2), (4) Date: Dec. 27, 2012

(87) PCT Pub. No.: WO2012/002580
PCT Pub. Date: Jan. 5, 2012

(65) Prior Publication Data
US 2013/0099276 A1    Apr. 25, 2013

(30) Foreign Application Priority Data

Jul. 1, 2010 (JP) ................. 2010-151304
Jul. 1, 2010 (JP) ................. 2010-151308

(51) Int. Cl.
*H01L 33/00* (2010.01)
*H01L 33/62* (2010.01)
(Continued)

(52) U.S. Cl.
CPC ............. *H01L 33/62* (2013.01); *H01L 33/46* (2013.01); *H01L 33/52* (2013.01); *H01L 33/60* (2013.01); *H01L 33/64* (2013.01); *H01L 2224/16225* (2013.01); *H01L 2224/48091* (2013.01); *H01L 2224/48227* (2013.01); *H01L 2924/01322* (2013.01); *H01L 2924/3025* (2013.01)

(58) Field of Classification Search
None
See application file for complete search history.

(56) References Cited

U.S. PATENT DOCUMENTS 7,456,500 B2 * 11/2008 Kromotis et al. ............. 257/725
7,658,866 B2 *  2/2010 Murazaki et al. ...... 252/301.4 R
(Continued)

FOREIGN PATENT DOCUMENTS

JP    2001-135662 A    5/2001
JP    2002-118293 A    4/2002
(Continued)

OTHER PUBLICATIONS

International Search Report for PCT/JP2011/065634, Aug. 9, 2011.

*Primary Examiner* — Hoang-Quan Ho

(57) ABSTRACT

An object of the invention is to provide an LED light source device and a manufacturing method for the same that can maintain high reflectance over an extended period of time notwithstanding the interaction between light and heat. More specifically, the invention provides an LED light source device that includes a substrate, an electrode formed on the substrate, a white inorganic resist layer deposited over the substrate so as to cover a surface thereof everywhere except where the electrode is formed, and an LED element connected to the electrode, wherein the white inorganic resist layer contains fine white inorganic particles dispersed or mixed into an inorganic binder, and a method for manufacturing such an LED light source device.

10 Claims, 14 Drawing Sheets

(51) Int. Cl.
*H01L 33/46* (2010.01)
*H01L 33/52* (2010.01)
*H01L 33/60* (2010.01)
*H01L 33/64* (2010.01)

(56) References Cited

U.S. PATENT DOCUMENTS

| | | | |
|---|---|---|---|
| 7,679,099 B2 * | 3/2010 | Pang | 257/99 |
| 7,728,343 B2 * | 6/2010 | Fujino et al. | 257/98 |
| 7,737,461 B2 * | 6/2010 | Maeda et al. | 257/99 |
| 7,825,422 B2 * | 11/2010 | Maeda et al. | 257/98 |
| 7,910,940 B2 * | 3/2011 | Koike et al. | 257/98 |
| 7,960,747 B2 * | 6/2011 | Sakamoto et al. | 257/98 |
| 8,212,272 B2 * | 7/2012 | Oyamada | 257/98 |
| 8,343,616 B2 * | 1/2013 | Urasaki et al. | 428/195.1 |
| 8,399,899 B2 * | 3/2013 | Matsuda et al. | 257/98 |
| 8,431,423 B2 * | 4/2013 | Basin et al. | 438/26 |
| 2005/0121686 A1 | 6/2005 | Keller | |
| 2006/0281203 A1 * | 12/2006 | Epler et al. | 438/22 |
| 2007/0252227 A1 | 11/2007 | Fukuda et al. | |
| 2008/0173884 A1 * | 7/2008 | Chitnis et al. | 257/98 |
| 2009/0039379 A1 * | 2/2009 | Shiraishi et al. | 257/99 |
| 2009/0256166 A1 * | 10/2009 | Koike et al. | 257/98 |
| 2009/0273000 A1 * | 11/2009 | Kon | 257/98 |
| 2010/0059782 A1 * | 3/2010 | Fujitomo et al. | 257/98 |
| 2011/0001156 A1 * | 1/2011 | Matsuda et al. | 257/98 |
| 2011/0012149 A1 * | 1/2011 | Basin et al. | 257/98 |
| 2011/0012151 A1 * | 1/2011 | Ono | 257/98 |
| 2011/0215366 A1 * | 9/2011 | Tsukagoshi et al. | 257/99 |
| 2012/0061709 A1 * | 3/2012 | Pachler | 257/98 |
| 2012/0091495 A1 * | 4/2012 | Hatanaka et al. | 257/98 |
| 2012/0256224 A1 * | 10/2012 | Hatanaka et al. | 257/98 |
| 2012/0273811 A1 * | 11/2012 | Krauter et al. | 257/88 |
| 2013/0037842 A1 * | 2/2013 | Yamada et al. | 257/98 |

FOREIGN PATENT DOCUMENTS

| | | | |
|---|---|---|---|
| JP | 2006-128625 A | | 5/2006 |
| JP | 2007-42687 A | | 2/2007 |
| JP | 2007-299929 A | | 11/2007 |
| JP | 2007-535130 A | | 11/2007 |
| JP | 2008-258296 A | | 10/2008 |
| JP | 2009-176847 A | | 8/2009 |
| JP | 2009176847 A | | 8/2009 |
| JP | 2009-212134 A | | 9/2009 |
| JP | 2009212134 A | * | 9/2009 |
| JP | 2011-129646 A | | 6/2011 |

\* cited by examiner

LED LIGHT SOURCE DEVICE AND MANUFACTURING METHOD FOR THE SAME

TECHNICAL FIELD

The present invention relates to an LED light source device and a manufacturing method for the same, and more particularly to an LED light source device having an LED light-emitting element and a method for manufacturing such an LED light source device.

BACKGROUND

In a light-emitting diode comprising a substrate, electrodes formed on the substrate, a light-emitting element mounted on the electrodes, and a sealing member that seals the light-emitting element onto the substrate, it is known to cover the substrate with a light-blocking film everywhere except where the electrodes are formed and then to form a light-reflecting film of a white-colored resin material on the light-blocking film (refer to patent document 1).

Further, in a light-emitting diode comprising a substrate, electrodes formed on the substrate, a light-emitting element mounted on the electrodes, and a sealing member that seals the light-emitting element onto the substrate, it is known to enhance reflectance of white light by forming a white inorganic resist layer everywhere on the substrate except where the electrodes are formed (refer to patent document 2). In patent document 2, it is described that an inorganic material, such as fine particles of titanium oxide ($TiO_2$) or fine particles of barium sulfate ($BaSO_4$), or an organic material, such as fine particles of porous acrylic resin or fine particles of polycarbonate resin, can be used for the formation of the white inorganic resist layer. It is also described that, as specific examples of the white inorganic resist layer, use may be made of solder resist FINEDEL DSR-330542-13W (tradename) manufactured by Tamura Kaken, S-100 W CM29 (tradename) manufactured by Taiyo Ink, and PHOTO FINER PMR-6000 W30/CA-40 G30 (tradename) manufactured by Taiyo Ink.

However, the light-reflecting film and the white inorganic resist layer described in patent documents 1 and 2, respectively, have been formed from a material composed principally of an organic material or formed by dispersing or mixing an inorganic material into an organic binder. While such material serves to enhance light reflectance, the problem has been that the material tends to degrade due to light and heat. In particular, even when the wavelength of the light is in the visible region, not in the ultraviolet region, of the spectrum, the organic material may decompose due to an interaction between light and heat, rendering the light-reflecting film or the white inorganic resist layer unable to serve its intended function properly. Furthermore, when forming the light-reflecting film or the white inorganic resist layer in the area surrounding the electrodes, it is common practice to use a printing method or the like, but when forming the light-reflecting film or the white inorganic resist layer by using such a method, a prescribed margin has to be provided around the electrodes. As a result, regions where the light-reflecting film or the white inorganic resist layer cannot be formed occur around the electrodes, and the presence of such regions has degraded the reflectance of the substrate as a whole.

On the other hand, it is known to provide a semiconductor device comprising an input/output electrode terminal portion, a conductive post formed on the input/output electrode terminal portion and having the substantially the same size as the input/output electrode terminal portion, and a resin layer formed on the same side as the conductive post, wherein the semiconductor device is mounted on a circuit substrate in such a manner that a terminal on the circuit substrate is connected to the conductive post (refer to patent document 3).

However, in patent document 3, the conductive post has been provided for the purpose of facilitating the placement of the resin layer as a sealing member for filling the gap created between the semiconductor device and the circuit substrate, not for the purpose of shrouding the electrodes of the semiconductor device with the resin layer.

It is also known to provide a light-emitting device comprising a light-emitting element which includes an n-type nitride semiconductor, a p-type nitride semiconductor, and an active layer interposed therebetween, a bump provided on the bonding surface of each electrode of the light-emitting element, and a transparent mold covering the entire light-emitting element while exposing the upper face of each bump (refer to patent document 4). In the light-emitting device disclosed in patent document 4, after forming the bumps, the transparent mold is formed so as to cover the bumps, and thereafter the surface of the transparent mold is ground to expose the surface of each bump.

In patent document 4, however, while the light-emitting device has been fabricated by forming the bumps and transparent mold on a wafer, no provisions have been made to enhance the reflectance of the substrate on which the light-emitting element is mounted.

Patent document 1: Japanese Unexamined Patent Publication No. 2009-176847
Patent document 2: Japanese Unexamined Patent Publication No. 2008-258296
Patent document 3: Japanese Unexamined Patent Publication No. 2001-135662
Patent document 4: Japanese Unexamined Patent Publication No. 2002-118293

SUMMARY

It is an object of the present invention to provide an LED light source device and a manufacturing method for the same that can solve the above-described deficiencies.

It is also an object of the present invention to provide an LED light source device and a manufacturing method for the same that can maintain high reflectance over an extended period of time notwithstanding the interaction between light and heat.

It is also an object of the present invention to provide an LED light source device and a manufacturing method for the same that can enhance the reflectance of the entire substrate.

It is also an object of the present invention to provide an LED light source device and a manufacturing method for the same that can enhance the utilization efficiency of light by making provisions so as to be able to efficiently reflect the light from the light-emitting element while suppressing the effects of the light and heat emitted from the light-emitting element.

An LED light source device includes a substrate, an electrode formed on the substrate, a white inorganic resist layer deposited over the substrate so as to cover a surface thereof everywhere except where the electrode is formed, and an LED element connected to the electrode, wherein the white inorganic resist layer contains fine white inorganic particles dispersed or mixed into an inorganic binder.

A method for manufacturing an LED light source device includes the steps of forming an electrode on a substrate, depositing a white resist material over the substrate so as to cover a surface thereof everywhere except where the electrode is formed, forming a white inorganic resist layer by grinding the white resist material and thereby exposing only a surface of the electrode, and connecting an LED element to the exposed electrode, wherein the white inorganic resist layer contains fine white inorganic particles dispersed or mixed into an inorganic binder.

Preferably, in the LED light source device and the method for manufacturing the LED light source device, the substrate is a resin substrate.

According to the LED light source device and the method for manufacturing the LED light source device, since the white inorganic resist layer is used that contains fine white inorganic particles dispersed or mixed into an inorganic binder, the degradation of the substrate due to light and heat can be greatly alleviated, thereby eliminating the need to use a substrate having high reflectance and high durability. Since a resin or like substrate can be used, the LED light source device can be fabricated with ease and at low cost.

According to the LED light source device and the method for manufacturing the LED light source device, since the white inorganic resist layer is used that contains fine white inorganic particles dispersed or mixed into an inorganic binder, stable operation can be maintained against the light and heat from the LED element, and the degradation of brightness of the LED light source device can be prevented over an extended period of time.

According to the LED light source device and the method for manufacturing the LED light source device, since the white inorganic resist layer is used that contains fine white inorganic particles dispersed or mixed into an inorganic binder, the white inorganic resist layer, the light reflective layer, the electrodes, and/or the substrate are prevented from decomposing and migrating into the sealing member, and as a result, the degradation of light intensity due to the deterioration of the sealing member or the degradation of the transparency of the sealing member can be prevented over an extended period of time.

According to the LED light source device and the method for manufacturing the LED light source device, since the white inorganic resist layer is used that contains fine white inorganic particles dispersed or mixed into an inorganic binder, the white inorganic resist layer has high thermal conductivity, and the heat generated from the LED element can be efficiently dispersed through the entire substrate, thus achieving a high heat dissipating effect. This prevents the heat from being concentrated or localized in a particular portion of the substrate, and thus the degradation of the substrate due to heat can be prevented over an extended period of time.

An LED light source device includes a substrate, an electrode formed on the substrate, a conductive post formed on the electrode, a reflective layer deposited so as to cover the substrate and the electrode everywhere except where the conductive post is formed, and a light-emitting element bonded to the conductive post.

Preferably, in the LED light source device, the light-emitting element is flip-chip mounted on the conductive post.

Preferably, in the LED light source device, the conductive post and the light-emitting element are bonded together by gold-tin eutectic bonding.

A method for manufacturing an LED light source device includes the steps of forming an electrode on a substrate, forming a conductive post on the electrode, depositing a reflecting material so as to cover the substrate, the electrode, and the conductive post, forming a reflective layer by grinding the reflective material and thereby exposing only a surface of the conductive post, and bonding a light-emitting element to the exposed conductive post.

According to the LED light source device and the method for manufacturing the LED light source device, since the light-emitting side of the LED light source device is covered with the reflective layer everywhere except where the conductive post to be connected to the element necessary for the device is formed, the reflecting efficiency of the device can be drastically enhanced.

According to the LED light source device and the method for manufacturing the LED light source device, the reflective layer is first formed so as to completely cover the light-emitting side surface of the substrate, and thereafter, the upper surface of the reflective layer is ground to expose the top of the conductive post; accordingly, compared with the case of forming a light reflective layer by printing, there is no need to provide a margin, etc. around the electrode, and as a result, the reflectance at the light-emitting side of the substrate can be drastically increased. Furthermore, since the light-emitting side surface of the substrate is completely covered with the reflective layer, a substrate material that has low reflectance or that is prone to degradation due to light and heat, for example, a resin substrate, can be used as the substrate.

DESCRIPTION OF EMBODIMENT

An LED light source device and a manufacturing method for the same will be described below with reference to the drawings. It will, however, be noted that the technical scope of the present invention is not limited to the specific embodiments described herein but extends to the inventions described in the appended claims and their equivalents.

Figure 1:
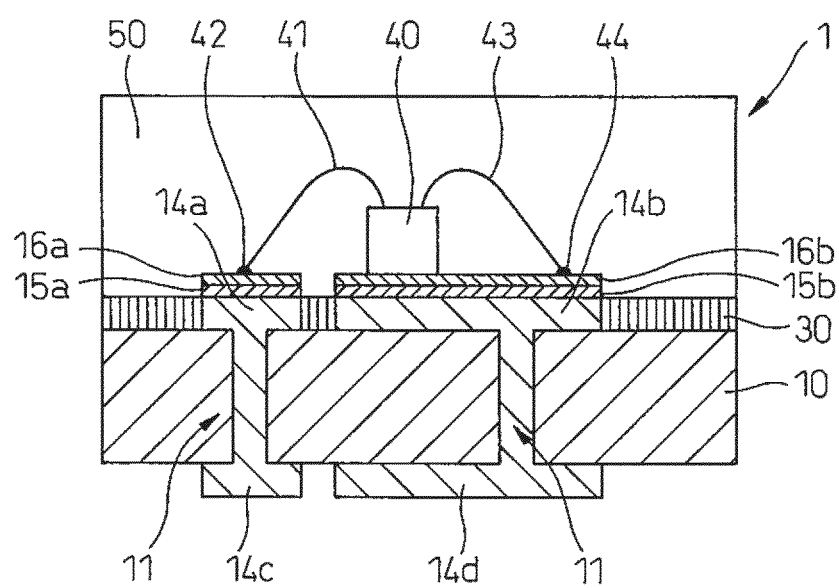
FIG. 1 is a schematic cross-sectional view of an LED light source device 1.

FIG. 1 is a schematic cross-sectional view of an LED light source device 1.

The LED light source device 1 includes: electrodes 14a and 14b formed on an upper surface (light-emitting side) of a substrate 10; electrodes 14c and 14d formed on a lower surface (for example, the side to be mounted to a mother substrate) of the substrate 10; a Ni-plated layer 15a and an Ag-plated layer 16a formed on top of the electrode 14a; a Ni-plated layer 15b and an Ag-plated layer 16b formed on top of the electrode 14b; a white inorganic resist layer 30; an LED element 40 bonded to the electrode 14b; a wire 41 connecting the LED element 40 with the electrode 14a; a wire 43 connecting the LED element 40 with the electrode 14b; and a sealing member 50 disposed so as to cover the LED element 40, the wires 41 and 43, and the upper surface of the substrate 10. The wire 41 is bonded to the electrode 14a at position 42, while the wire 43 is bonded to the electrode 14b at position 44.

The substrate 10 is formed from an epoxy resin (glass epoxy resin) whose thermal and dimensional stability is reinforced by glass cloth and an inorganic filler. However, the substrate 10 may be formed from other material having electrical insulation and heat resistance, such as Bakelite commonly used for a printed wiring board, a BT resin substrate using a BT resin having higher heat resistance than the ordinary epoxy resin, a silicone substrate, a ceramic substrate of aluminum nitride, etc. In particular, a substrate material having low reflectance, such as an ordinary colored epoxy resin having an ivory or like color, silicone, aluminum nitride (reflectance of about 40%), or transparent glass, can also be used for the substrate, since the white inorganic resist layer 30 is formed over the entire light-emitting side surface of the substrate 10.

The electrodes 14a and 14c are electrically interconnected via a plated-through hole 11 formed in the substrate 10. Likewise, the electrodes 14b and 14d are electrically interconnected via a plated-through hole 11 formed in the substrate 10. The electrodes 14a, 14b, 14c, and 14d are formed from Cu. The wires 41 and 43 are formed from Au.

The white inorganic resist layer 30 is formed by dispersing or mixing a titanium oxide filler in the form of white colored inorganic particles into a silica sol that functions as an inorganic binder. Usually, the white inorganic resist layer 30 contains a catalyst (for example, an organic acid such as acetic acid or an inorganic acid such as hydrochloric acid) for curing the resist at low temperatures (about 150° C.), but the curing reaction will proceed without such a catalyst.

The white inorganic resist layer 30 is not limited to the above-described material, but use may be made of other suitable material, as long as the material includes a white colored filler dispersed into an inorganic binder. For the inorganic binder, use may be made, for example, a silicon compound such as alkali silicate, colloidal silica, aqueous silica sol, organo-silica sol, etc., an inorganic colloid such as colloidal alumina, colloidal zirconia, etc., or a polyvalent metal alkoxide such as alkyl silicate. For the white colored filler, use may be made of titanium oxide, barium sulfate, alumina white, talc, or the like.

The LED element 40 is constructed from a nitride-based compound semiconductor that emits blue light (for example, a blue LED). The LED element 40 is mounted with its light emitting part facing upward in the figure and with its bottom bonded to the electrode 14b, and is connected to the electrodes 14a and 14b via the respective wires 41 and 43. Alternatively, the LED element 40 may be flip-chip mounted with its light emitting part face down by using gold bumps. It is preferable that the gold bump structure be a multilayered structure consisting of a gold-tin eutectic layer, a gold bump layer, and a UBM (under-bump metal) layer. The gold-tin eutectic bonding using such gold bumps allows the LED element 40 to be bonded to the electrode at relatively low temperatures (about 300° C.), and since the bonding remains unaffected when soldering the LED light source device 1 to the mother substrate in a subsequent reflow process (at about 260° C.), the connection reliability can be increased.

The sealing member 50 is constructed from an optically transmissive silicone-based resin material and is formed on the white inorganic resist layer 30 so as to cover the wires 41 and 43 and the LED element 40. Further, a cerium-activated yttrium aluminum garnet (YAG) phosphor is mixed in the sealing member 50 so that the blue light from the LED element 40 and the yellow light from the phosphor are mixed together to give the sensation of white light. However, the kinds and structures of the LED element 40 and sealing member 50 are not limited to those described above, but other kinds of LEDs or phosphors may be used; alternatively, the sealing member 50 may be formed without containing phosphors.

In the LED light source device 1, the light produced by the LED element 40 and emitted downward from the phosphors contained in the sealing member 50 is reflected by the white inorganic resist layer 30 and emitted outside by passing through the sealing member 50. Since the white inorganic resist layer 30 covers the entire surface of the substrate 10 except where the electrodes 14a and 14b are formed, the reflectance of the LED light source device 1 can be maintained at a very high level. Furthermore, the white inorganic resist layer 30 has a high heat conducting effect and causes the heat from the LED element 40 to be efficiently conducted to the entire area of the substrate 10. This offers the effect of preventing the heat from localizing in specific portions of the white inorganic resist layer 30 and the substrate 10 and denaturing, discoloring, or decomposing the material.

The manufacturing method of the LED light source device 1 will be described below with reference to FIGS. 2 and 3.

Figure 2A:
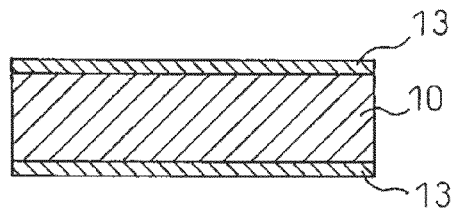
FIGS. 2(a) to 2(g) are diagrams (part 1) for explaining the fabrication process of the LED light source device 1.
Figure 2B:
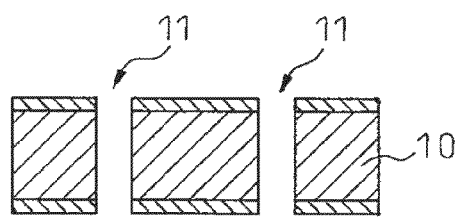

First, the substrate 10 formed from an ivory colored BT resin, with copper foil 13 laminated on both sides thereof, is prepared as shown in FIG. 2(a), and two through-holes 11 are formed in the substrate 10 as shown in FIG. 2(b).

Figure 2C:
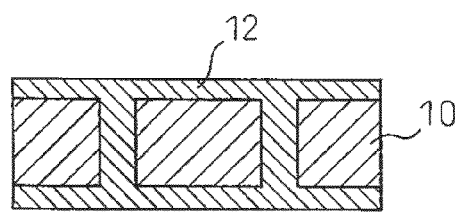

Next, in order to interconnect the upper and lower electrodes, the through-holes are filled with Cu 12 by means of copper plating, as shown in FIG. 2(c).

Figure 2D:
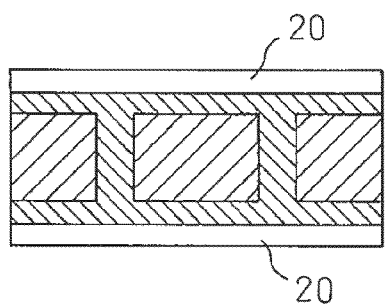

Subsequently, photoresist 20 is applied over the surfaces of the substrate 10, as shown in FIG. 2(d). Before applying the photoresist 20, the surfaces of the substrate 10 may be treated in order to form the electrodes thereon, as will be described later.

Figure 2E:
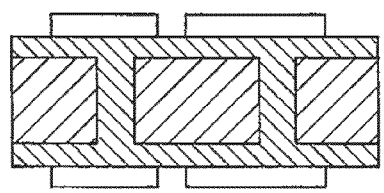
Figure 2F:
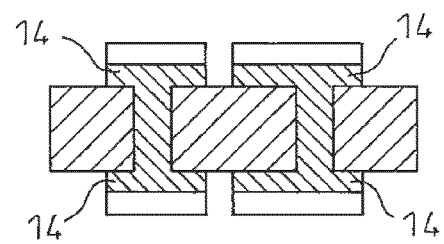
Figure 2G:
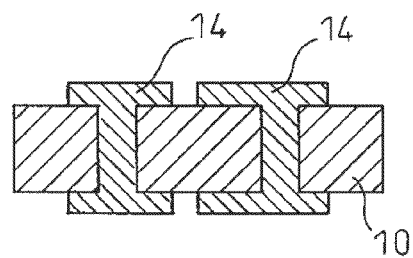

Next, using a technique of photolithography, the photoresist 20 is first exposed in the desired interconnection pattern, and then the photoresist 20 is selectively removed, as shown in FIG. 2(e); then, after etching off the exposed Cu surfaces, as shown in FIG. 2(f), the remaining photoresist 20 is removed, as shown in FIG. 2(g), to complete the fabrication of the electrodes 14 formed from Cu. The electrodes 14 on the upper and lower sides of the substrate 10 are electrically interconnected via the through-holes 11. The thickness of each electrode 14 is 30 to 45 µm.

Figure 3A:
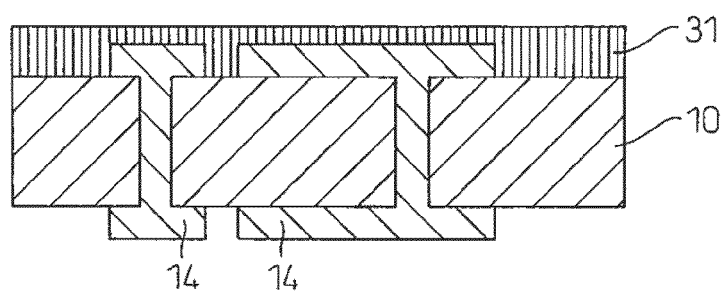
FIGS. 3(a) to 3(d) are diagrams (part 2) for explaining the fabrication process of the LED light source device 1.

Next, as shown in FIG. 3(a), white colored resist is deposited by screen printing above the substrate 10 in such a manner as to cover the entire upper surface of the substrate 10 including the electrodes 14. After that, the resist is cured under an atmosphere of 150° C., to form the white inorganic resist layer 31. Since the thickness of each electrode 14 is 30 to 45 μm, as earlier described, it is preferable to form the white inorganic resist layer 31 at a thickness of about 35 to 50 μm. The white colored resist used here is prepared by dispersing a titanium oxide filler as a white pigment and a silica filler for preventing shrinkage when curing into a silica sol that functions as an inorganic binder.

Figure 3B:
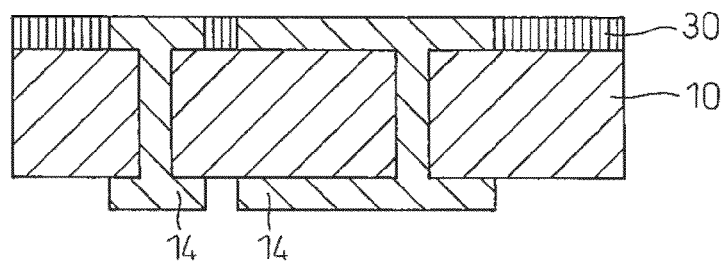

Next, as shown in FIG. 3(b), the white inorganic resist layer 31 is buffed until the upper surface of each electrode 14 is exposed, to complete the formation of the white inorganic resist layer 30. The thickness of the white inorganic resist layer 30 is thus set equal to the thickness of the electrodes 14.

Figure 3C:
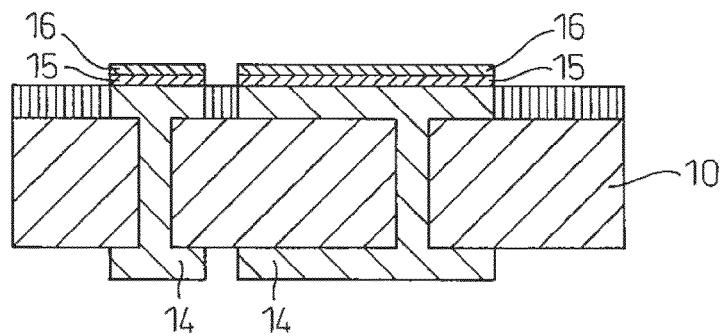

Subsequently, the Ni-plated layer 15 and the Ag-plated layer 16 are formed on top of each electrode 14, as shown in FIG. 3(c).

Figure 3D:
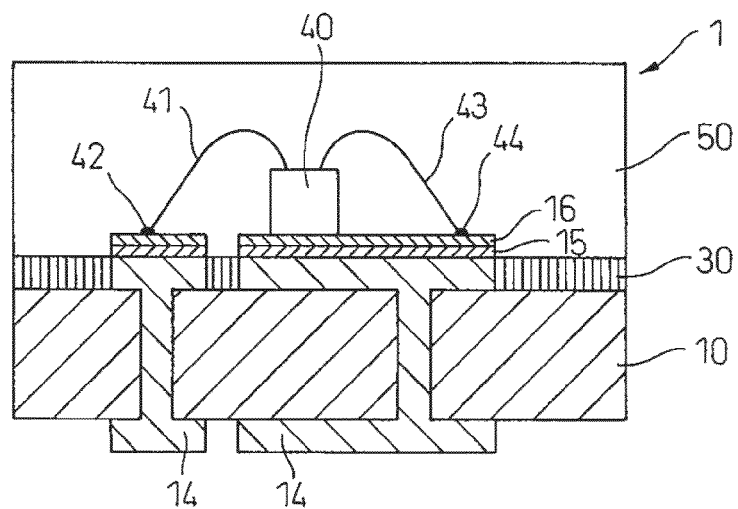

Next, as shown in FIG. 3(d), the LED element 40 is bonded to the electrode on which the Ni- and Ag-plated layers have been formed, and the LED element 40 is connected to the respective electrodes 14 via the wires 41 and 43. After that, the sealing member 50 is formed so as to cover the wires 41 and 43 and the LED element 40, to complete the fabrication of the LED light source device 1.

Figure 4:
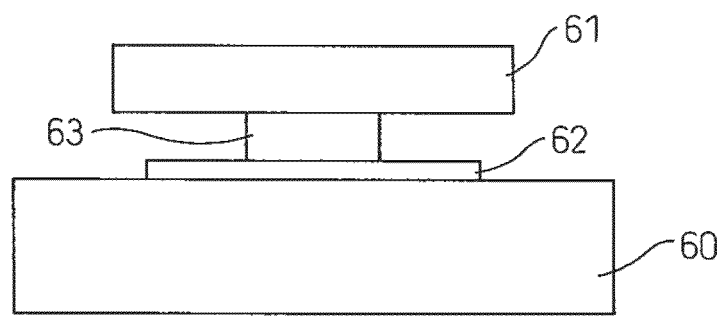
FIG. 4 is a schematic diagram showing the construction of test equipment used to test the heat resistance and light resistance of a substrate.

FIG. 4 is a schematic diagram showing the construction of test equipment used to test the heat resistance and light resistance of the substrate.

The test equipment shown in FIG. 4 includes an Al plank 60, the substrate 62 under test placed on the plank 60, an LED device package 63 placed with its light-emitting side contacting the substrate 62 under test, and an Al block 61 placed on the LED device package 63. The LED device package 63 is constructed using the LED element 40 of the LED light source device 1 described above, but its driving unit (including the power supply) is not shown here. The LED device package 63 is actually a 5W-class LED package constructed by arraying many LED elements 40. The Al block 61 need only be heavy enough that light does not leak from the contacting surfaces of the LED device package 63 and the substrate 62 under test.

FIGS. 5 and 6 are diagrams showing the results of an experiment conducted using the test equipment shown in FIG. 4.

The experiment was conducted by placing the test equipment of FIG. 4 under an atmosphere of 100° C. with the LED device package 63 left turned on for one week, and the condition of the substrate was examined before and after the experiment.

Figure 5A:
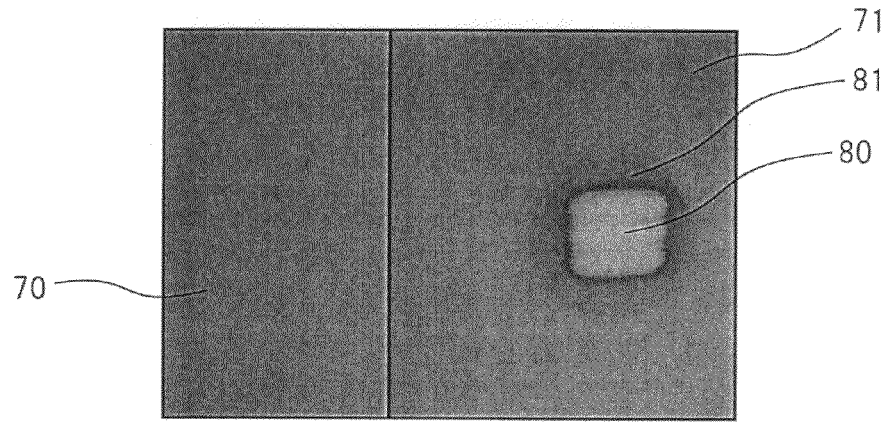
FIGS. 5(a) to 5(c) are diagrams showing the results of an experiment conducted using the test equipment shown in FIG. 4.

FIG. 5(a) shows the result when the above experiment was conducted on an ivory colored BT resin substrate, the same one used as the substrate 10, but without forming the white inorganic resist layer 30 thereon. In FIG. 5(a), reference numeral 70 indicates a portion of the substrate surface before the experiment, and 71 indicates the substrate surface after the experiment.

On the substrate surface after the experiment, it is seen that the portion 80 contacted with the LED device package 63 has decomposed, leaving only the glass cloth and the filler because of the phenomenon of blushing. Furthermore, its surrounding portion 81 has discolored and turned brown. In the portion 80, it can be deduced that the organic material in the substrate has degraded and decomposed into low molecules because of the interaction between the light and heat from the LED device package 63. On the other hand, in the surrounding portion 81, it can be deduced that the substrate surface has discolored because of the heat from the LED device package 63.

Figure 5B:
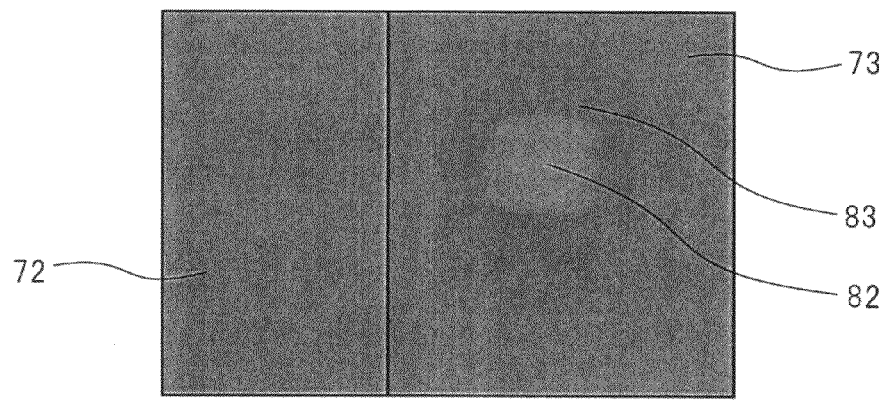

FIG. 5(b) shows the result when the above experiment was conducted after resist ink LE-6000S (tradename) manufactured by San-Ei Kagaku (prepared by mixing titanium oxide as a white inorganic pigment into an epoxy acrylate resin), a material equivalent to the white colored material described in patent document 2, was deposited to a thickness of 30 μm on an ivory colored BT resin substrate, the same one used as the substrate 10. In FIG. 5(b), reference numeral 72 indicates a portion of the substrate surface before the experiment, and 73 indicates the substrate surface after the experiment.

On the substrate surface after the experiment, it is seen that the portion 82 in contact with the LED device package 63 has degraded because of the blushing not only of the resist ink but also of the substrate of the BT resin, and that the resist-ink-coated surface, which was initially glossy, has turned into a matte surface, a condition similar to that shown in FIG. 5(a). Furthermore, the surface of its surrounding portion 83 coated with the resist ink has also turned into a matte surface, and the underlying BT resin substrate has discolored and turned brown, a condition similar to that shown in FIG. 5(a). In the portion 82, it can be deduced that the organic binder contained in the resist ink has degraded and decomposed into low molecules because of the interaction between the light and heat from the LED device package 63, leaving only the inorganic particles, and that the underlying BT resin has also decomposed, leaving only the glass cloth and the filler. On the other hand, in the surrounding portion 83, it can be deduced that the organic binder contained in the resist ink has decomposed and the BT resin also discolored because of the heat from the LED device package 63. In the experiment, the resist ink prepared by mixing or dispersing a white colored inorganic filler into an organic binder was used, but when a resist ink prepared by mixing or dispersing a white colored organic filler into an organic binder is used, it can be deduced that not only the organic binder but the organic filler will also decompose.

Figure 5C:
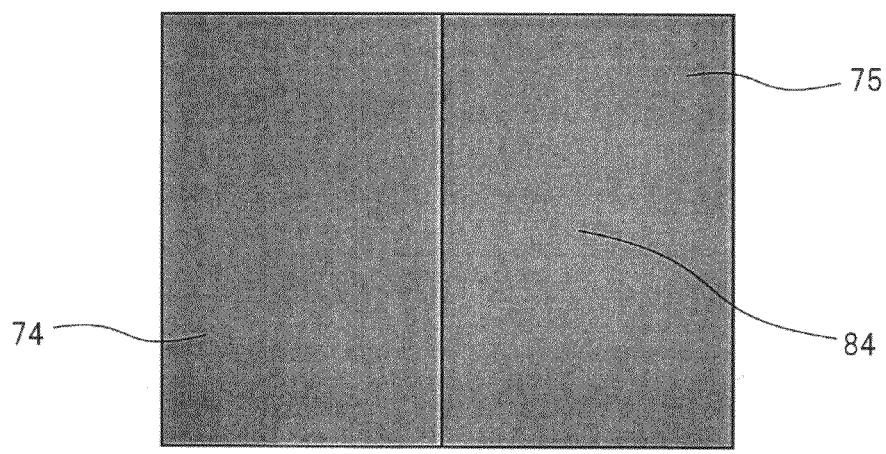

FIG. 5(c) shows the result when the above experiment was conducted after white inorganic resist (prepared by dispersing fine particles of titanium oxide ($TiO_2$) into an inorganic binder), the same material used for the white inorganic resist layer 30 shown in FIG. 1, was deposited at a thickness of 30 μm on an ivory colored BT resin substrate, the same one used as the substrate 10. In FIG. 5(c), reference numeral 74 indicates a portion of the substrate surface before the experiment, and 75 indicates the substrate surface after the experiment.

When the substrate surface was visually examined after the experiment, the condition of the portion 84 in contact with the LED device package 63 was the same as before the experiment, and no particular blushing or discoloring was observable. Though not shown here, no visually appreciable differences were found on the back surface of the substrate before and after the experiment. On the other hand, in the case of the substrate surfaces 71 and 73 shown in FIGS. 5(a) and 5(b), respectively, the back of the portion contacted with the LED device package 63 has discolored and turned dark brown. From the above results, it can be deduced that the white inorganic resist prepared by dispersing fine inorganic particles into an inorganic binder, and formed as the resist layer on the substrate, was substantially unaffected by the interaction between the light and heat, because the material used was the same as that used for the white inorganic resist layer 30.

The reflectance of each substrate sample at 450 nm, i.e., at the peak wavelength of the blue LED, was measured by a colorimeter before and after the heat resistance and light resistance test; the results are shown in Table 1 below.

| Portions measured | Reflectance |
| --- | --- |
| 70 | 45% |
| 80 | 68% |
| 81 | 32% |
| 72 | 68% |
| 82 | 80% |
| 83 | 51% |
| 74 | 83% |
| 84 | 83% |

From the results shown in Table 1, it can be seen that the substrate of FIG. 5(c) constructed in accordance with the present invention can retain significantly higher reflectance than the other substrates (shown in FIGS. 5(a) and 5(b)).

Figure 6A:
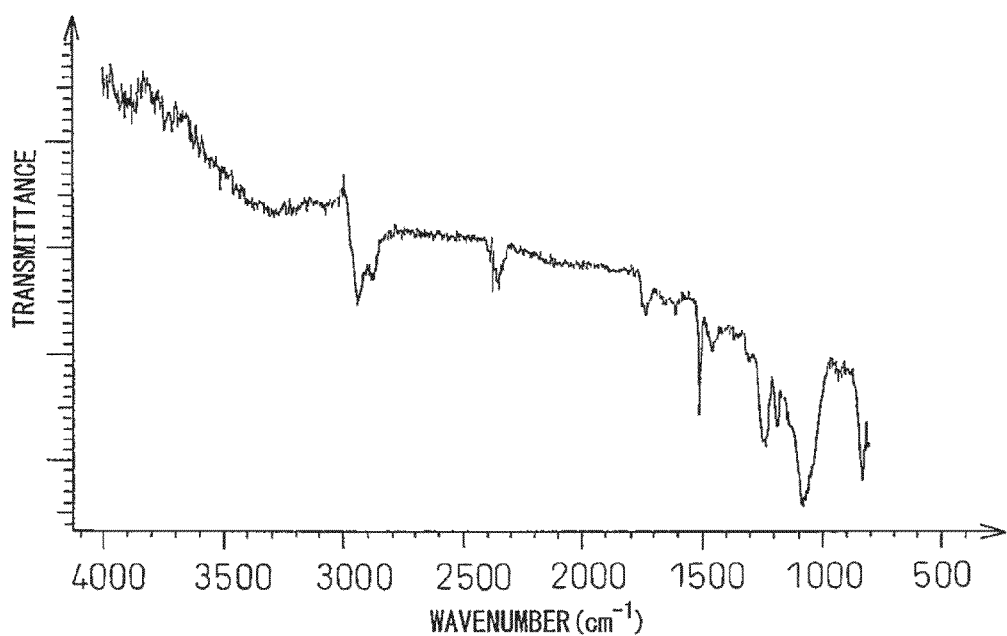
FIGS. 6(a) and 6(b) are diagrams showing the results of an experiment conducted using the test equipment shown in FIG. 4.
Figure 6B:
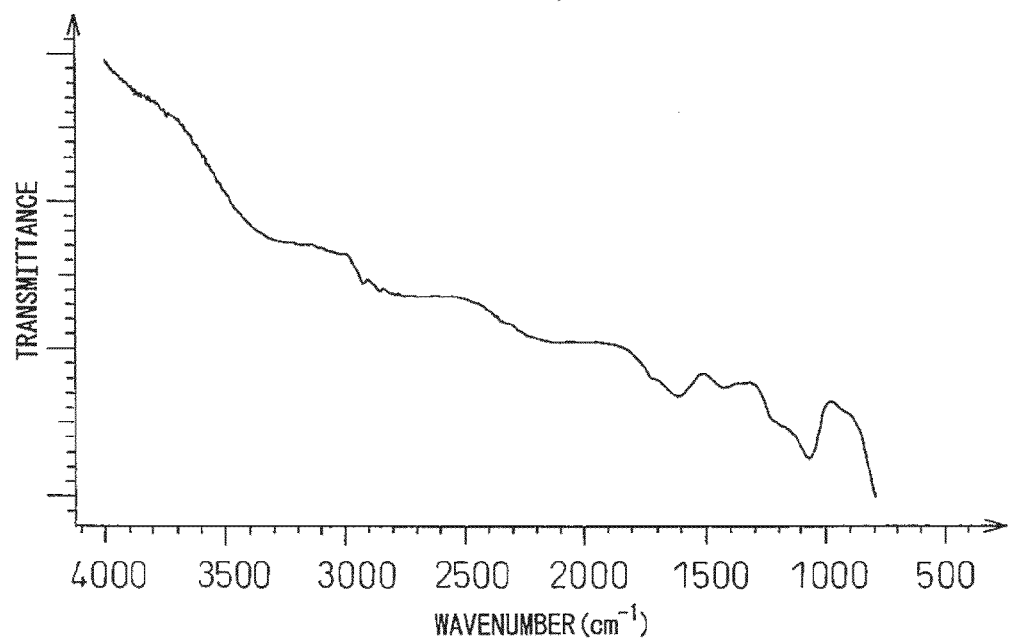

FIG. 6 shows the results of measurements when the heat resistance and light resistance experiment was conducted on the substrate 10 formed from a white glass epoxy resin filled with a white inorganic filler but without forming the white inorganic resist layer 30 on the substrate, and when the infrared absorption spectrum on the surface of the substrate 10 was measured before and after the experiment. FIG. 6(a) shows the result before the experiment, and FIG. 6(b) shows the result after the experiment.

In FIG. 6(a) showing the result before the experiment, many peaks attributed to the epoxy resin in the glass epoxy resin substrate are observed in the region from 1000 cm$^{-1}$ to 3000 cm$^{-1}$, but in FIG. 6(b) showing the result after the experiment, such peaks have disappeared, and only broad peaks due to the inorganic material such as glass and filler are observed.

Figure 7:
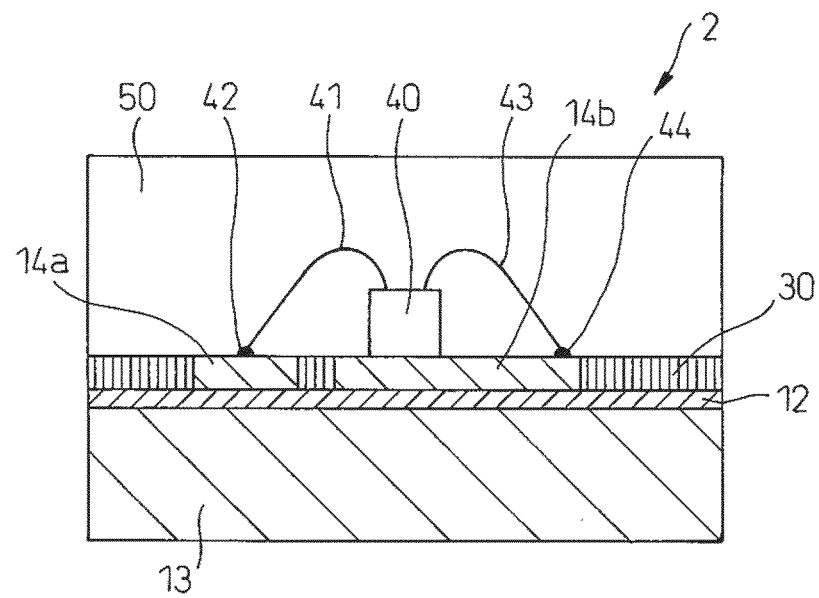
FIG. 7 is a schematic cross-sectional view of an alternative LED light source device 2.

FIG. 7 is a schematic cross-sectional view of an alternative LED light source device 2.

In FIG. 7, the same component elements as those of the LED light source device 1 shown in FIG. 1 are designated by the same reference numerals, and will not be further described herein. In FIG. 7, the difference from the LED light source device 1 shown in FIG. 1 is that the resin substrate 12 is mounted on a heat-sinking Al metal substrate 13. Compared with the substrate 10 of the LED light source device 1 shown in FIG. 1, the thickness of the resin substrate 12 is reduced to about 100 μm so that the heat from the LED element 40 can be easily conducted to the Al metal substrate 13.

The electrodes 14a and 14b are formed on the resin substrate 12, and the white inorganic resist layer 30 is formed over the entire surface of the resin substrate 12 except where the electrodes 14a and 14b are formed. The method of manufacturing the white inorganic resist layer 30 is the same as the method of manufacturing the white inorganic resist layer 30 previously described in connection with the LED light source device 1.

The LED element 40 is bonded to the electrodes 14a and 14b at positions 42 and 43 via the respective wires 41 and 43. A Ni—Au plated layer may be formed on the surface of each of the electrodes 14a and 14b. Further, it is to be understood that the electrodes 14a and 14b are each connected to an electrode (not shown) for connecting to the mother substrate, etc.

In the LED light source device 2 of FIG. 7 also, since the white inorganic resist layer 30 is formed everywhere on the resin substrate 12 except where the electrodes 14a and 14b are formed, degradation due to the light and heat from the LED element 40 can be prevented over an extended period of time, as in the case of the LED light source device 1 shown in FIG. 1.

Figure 8:
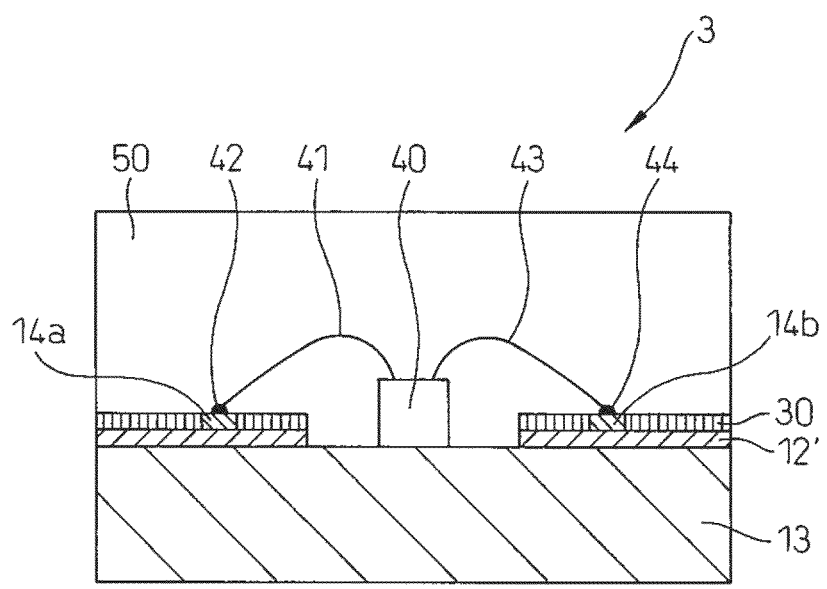
FIG. 8 is a schematic cross-sectional view of another alternative LED light source device 3.

FIG. 8 is a schematic cross-sectional view of another alternative LED light source device 3.

In FIG. 8, the same component elements as those of the LED light source device 2 shown in FIG. 7 are designated by the same reference numerals, and will not be further described herein. In FIG. 8, the difference from the LED light source device 2 shown in FIG. 7 is that the LED element 40 is not bonded to the electrode 14b but bonded directly to the Al metal substrate 13. Accordingly, in the LED light source device 3 of FIG. 8, the resin substrate 12' is not formed in the portion where the LED element 40 is bonded to the Al metal substrate 13.

Further, in the LED light source device 3 shown in FIG. 8, the white inorganic resist layer 30 is formed everywhere on the resin substrate 12' except where the electrodes 14a and 14b are formed, but is not formed on the Al metal substrate 13. This is because the Al metal substrate 13 has resistance to heat and light. However, in order to further enhance the reflectance, the white inorganic resist layer 30 may also be formed on the portion of the Al metal substrate 13 where the resin substrate 12' is not formed.

In the LED light source device 3 of FIG. 8 also, the white inorganic resist layer 30 is formed everywhere on the resin substrate 12' except where the electrodes 14a and 14b are formed. Accordingly, in the LED light source device 3, degradation due to the light and heat from the LED element 40 can be prevented over an extended period of time, as in the case of the LED light source device 1 shown in FIG. 1.

Figure 9:
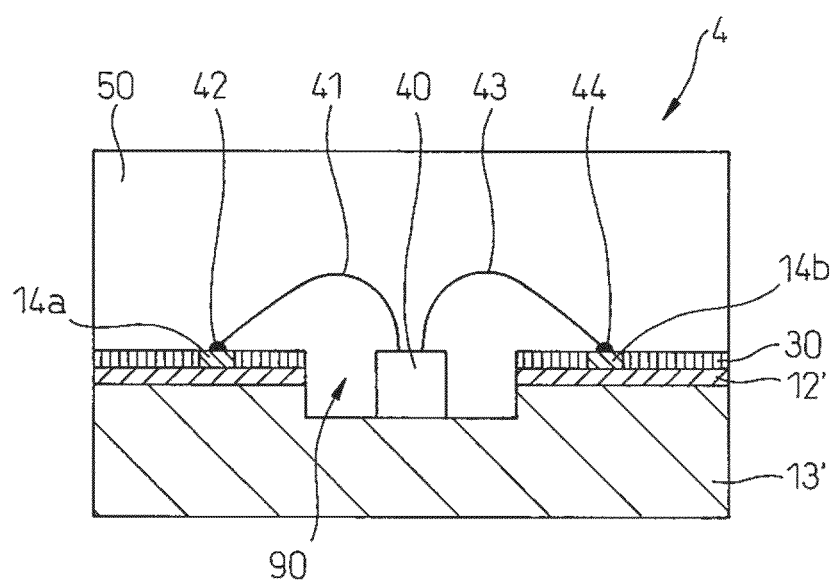
FIG. 9 is a schematic cross-sectional view of still another alternative LED light source device 4.

FIG. 9 is a schematic cross-sectional view of still another alternative LED light source device 4.

In FIG. 9, the same component elements as those of the LED light source device 3 shown in FIG. 8 are designated by the same reference numerals, and will not be further described herein. In FIG. 9, the difference from the LED light source device 3 shown in FIG. 8 is that the LED element 40 is bonded to the Al metal substrate 13' in a recessed portion 90 formed in the Al metal substrate 13'. Accordingly, in the LED light source device 4 of FIG. 9, the recessed portion 90 of the Al metal substrate 13' is not covered by the resin substrate 12'.

Further, in the LED light source device 4 shown in FIG. 9, the white inorganic resist layer 30 is formed everywhere on the resin substrate 12' except where the electrodes 14a and 14b are formed, but is not formed in the recessed portion 90 of the Al metal substrate 13'. This is because the Al metal substrate 13' has resistance to heat and light. However, in order to further enhance the reflectance, the white inorganic resist layer 30 may also be formed in the recessed portion 90 of the Al metal substrate 13'.

In the LED light source device 4 of FIG. 9 also, the white inorganic resist layer 30 is formed everywhere on the resin substrate 12' except where the electrodes 14a and 14b are formed. Accordingly, in the LED light source device 4, degradation due to the light and heat from the LED element 40 can be prevented over an extended period of time, as in the case of the LED light source device 1 shown in FIG. 1.

Figure 10A:
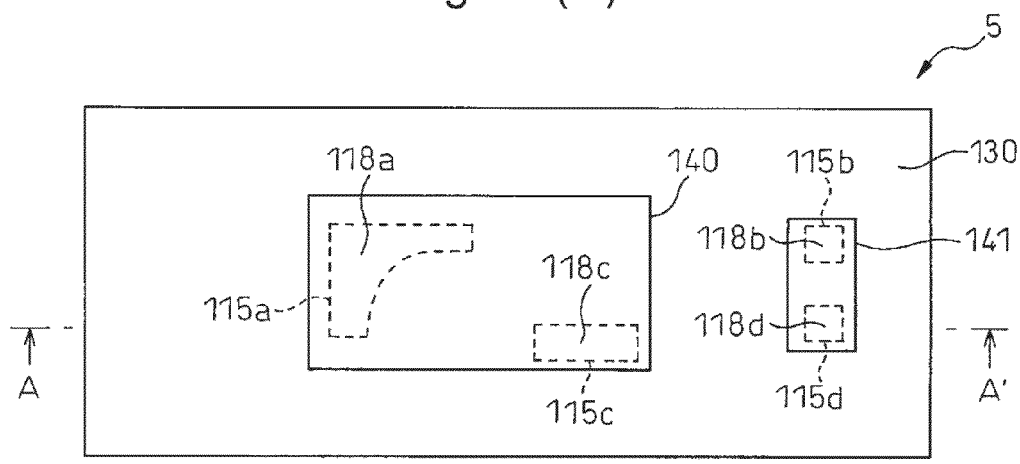
FIG. 10 is a schematic diagram of yet another alternative LED light source device 4.
Figure 10B:
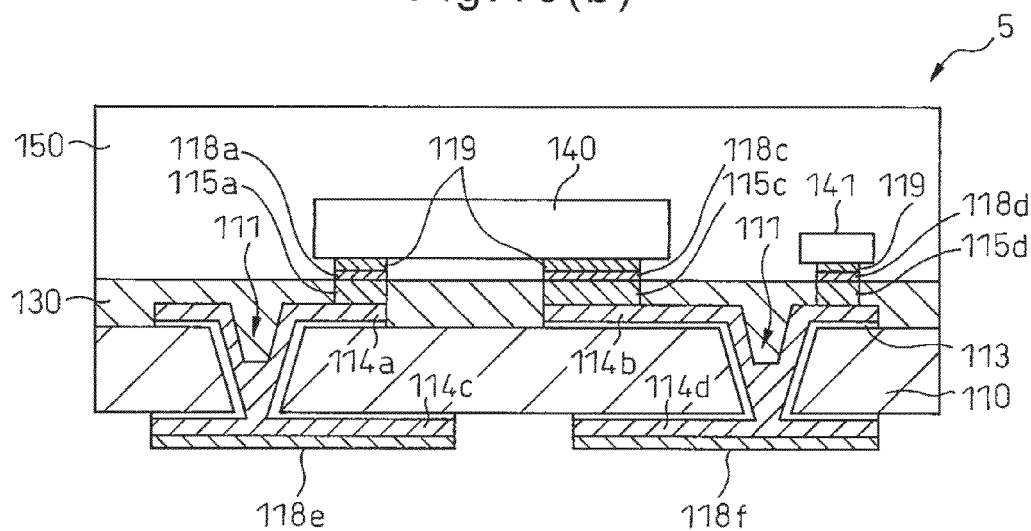

FIG. 10(a) is a top plan view of yet another alternative LED light source device 5, and FIG. 10(b) is a cross-sectional view taken along AA' in FIG. 10(a).

The LED light source device 5 includes: electrodes 114a and 114b formed on an upper surface (light-emitting side) of a substrate 110; electrodes 114c and 114d formed on a lower surface (the side to be mounted to a mother substrate) of the substrate 110; conductive posts 115a and 115b formed on the electrode 114a; and conductive posts 115c and 115d formed on the electrode 114b. The electrodes 114a, 114b, 114c, and 114d and the conductive posts 115a, 115b, 115c, and 115d are each formed from Cu.

The substrate 110 is formed from ceramic. However, the substrate 110 may be formed from another material having electrical insulation and heat resistance, such as glass epoxy, BT resin, silicone, aluminum nitride, etc. In particular, silicone, aluminum nitride (reflectance of about 40%), glass, resin, etc., having low reflectance can also be used for the substrate, since a reflective layer 130 (white inorganic resist layer) is formed, as will be described later, over the entire light-emitting side surface of the substrate 110.

The electrodes 114a and 114c are electrically interconnected via a plated-through hole 111 formed in the substrate 110, and the electrodes 114b and 114d are also electrically interconnected via a plated-through hole 111 formed in the substrate 110. Further, since the reflective layer 130 is formed over the electrodes as will be described later, there is no need to consider the degradation of the reflectance due to the presence of the electrodes. This provides greater freedom when designing the electrodes because, for example, there is no need to specifically reduce the electrode thickness.

Ni—Au plated layers 118a, 118b, 118c, and 118d are formed on the surfaces of the respective conductive posts 115a, 115b, 115c, and 115d. Likewise, Ni—Au plated layers 118e and 118f are formed on the surfaces of the respective electrodes 114c and 114d. The Ni—Au plated layers 118a to 118f each have a two-layered structure with a Ni layer formed directly on the electrode or conductive post and an Au layer formed on top of the Ni layer.

The reflective layer 130 is formed on the upper surface of the substrate 110 so as to cover the substrate surface and the electrodes 114a and 114b except where the conductive posts 115a, 115b, 115c, and 115d are formed. A seed metal layer of TiW—Cu is formed between the substrate 110 and the respective electrodes 114a, 114b, 114c, and 114d.

The reflective layer 130 is formed from a white paste ink (white inorganic resist material) prepared by kneading fine reflective particles of titanium oxide with a binder of organopolysiloxane and compacted by sintering. Other kinds of fine reflective inorganic particles may be used for the white ink.

Since the reflected light from the reflective layer 130 has no directionality but is scattered well, the reflective layer 130 is particularly advantageous when the light source is designed to emit white light by using the blue LED in conjunction with the phosphors mixed in the sealing member 150. That is, the reflective layer 130 formed from the white ink described above is more preferable, compared with a metal reflective layer, such as an Ag electrode, whose reflected light has directionality.

An LED element 140 constructed from a light-emitting diode or the like is mounted on the conductive posts 115a and 115c in a flip-chip fashion with its light emitting part face down, and a zener diode 141 is mounted in a flip-chip fashion on the conductive posts 115b and 115d.

The LED element 140 and the zener diode 141 are connected to the respective conductive posts via gold bumps 119. The gold bumps 119 are each formed in a multilayered structure having a gold-tin eutectic layer of thickness 2 to 3 μm, a gold bump layer of thickness 10 to 30 μm, and a UBM (under-bump metal) layer of thickness 0.3 μm. The UBM layer is formed in contacting relationship with the LED element 140 or the zener diode 141, while the gold-tin eutectic layer is formed in contacting relationship with the conductive post 115, and the gold bump layer is formed between the gold-tin eutectic layer and the UBM layer. The UBM layer is a portion of a common electrode that has been left when forming the gold bump 119 by electrolytic plating and electrically isolating the gold bump, and has a two-layered structure of TiW and Au.

The gold-tin eutectic bonding using the gold bumps 119 allows the LED element 140 and the zener diode 141 to be bonded to the conductive posts at relatively low temperatures (about 300° C.). In addition, since the bonding remains unaffected when soldering the LED light source device 5 to the mother substrate in a subsequent reflow process (at about 250° C.), the connection reliability can be increased. Solder bumps, gold stud bumps, etc., may be used instead of the gold bumps 119. Further, the LED element 140 may be connected to the conductive posts by bonding wires. Furthermore, the LED light source device 5 need not necessarily include the zener diode 141.

The sealing member 150 is constructed from an optically transmissive silicone-based resin material and is formed on the reflective layer 130 so as to cover the LED element 140 and the zener diode 141. A fluorescent material may be mixed as needed in the sealing member 150. For example, a nitride-based compound semiconductor that emits blue light (for example, a blue LED) may be used as the LED element 140, and a cerium-activated yttrium aluminum garnet (YAG) phosphor may be mixed in the sealing member 150 so that the blue light from the LED element 140 and the yellow light from the phosphor are mixed together to give the sensation of white light.

In the LED light source device 5, the light from the LED element 140 is reflected by the reflective layer 130 and emitted outside by passing through the sealing member 150. Since the reflective layer 130 covers the entire surface of the substrate 110 except where the conductive posts 115a to 115d are formed, the reflectance of the LED light source device 5 can be maintained at a very high level. Furthermore, the reflective layer 130 has the function of blocking the light emitted from the LED element 140 from reaching the substrate 110, while allowing the heat from the LED element 140 to be conducted uniformly (not locally) to the substrate 110; the reflective layer 130 thus serves to prevent the substrate 110 from degrading due to heat and light.

The manufacturing method of the LED light source device 5 will be described below with reference to FIGS. 11 to 13.

Figure 11A:
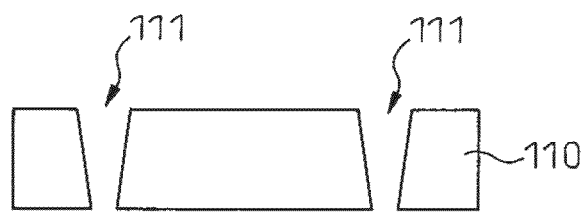
FIGS. 11(a) to 11(d) are diagrams (part 1) for explaining the fabrication process of the LED light source device 5.

First, as shown in FIG. 11(a), two through-holes 111 are formed in the substrate 110 constructed from a ceramic material. In FIG. 11(a), each through-hole is formed with its inner diameter gradually decreasing from the top toward the bottom in the figure, but alternatively, the inner diameter may be made the same from the top through to the bottom or may be made to increase from the top toward the bottom.

Figure 11B:
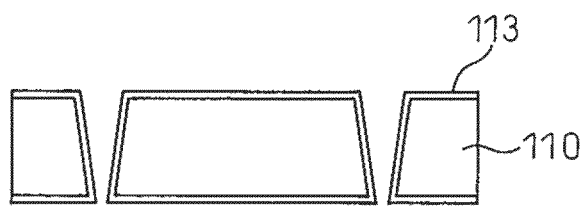

Subsequently, the seed metal layer 113 (thickness 0.3 μm) having a two-layered structure of TiW—Cu is formed by vapor deposition over the entire surface of the substrate 110, as shown in FIG. 11(b). The formation of the seed metal layer 113 corresponds to the surface treatment for electrolytic plating to be described hereinafter.

Figure 11C:
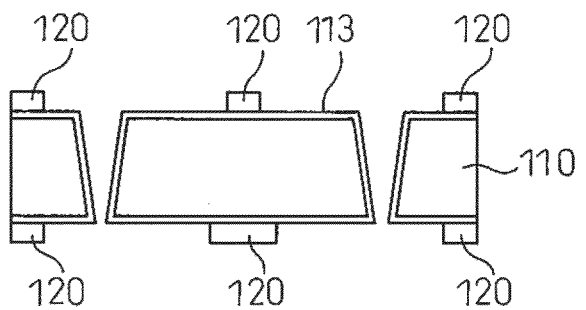

Next, as shown in FIG. 11(c), a resist pattern 120 for electrode formation is formed on the substrate 110 by photolithography.

Figure 11D:
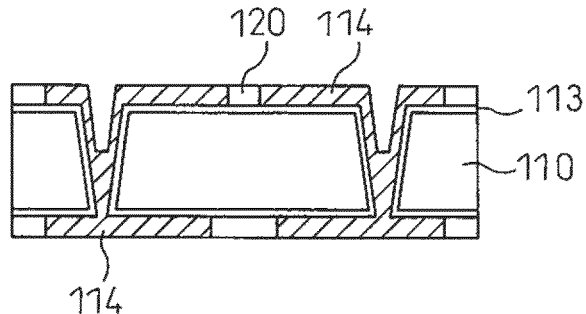

Then, using the resist pattern 120, the electrodes 114 of Cu are formed by electrolytic plating, as shown in FIG. 11(d). The electrodes 114 on the upper and lower sides of the substrate 110 are electrically interconnected via the through-holes 111. The thickness of each electrode 114 is 10 to 15 μm. In FIG. 11(d), the electrodes 114 are provided with shallow depressions to conform to the configurations of the through-holes 111, but the electrodes 114 may not be provided with such depressions.

Figure 12A:
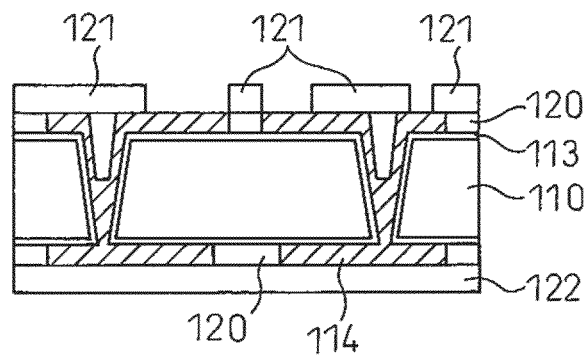
FIGS. 12(a) to 12(d) are diagrams (part 2) for explaining the fabrication process of the LED light source device 5.

Next, as shown in FIG. 12(a), a resist pattern 121 for conductive post formation is formed by photolithography on the resist pattern 120 as well as on the electrodes 114. At the same time, a masking tape 122 is applied over the entire lower surface of the substrate 110.

Figure 12B:
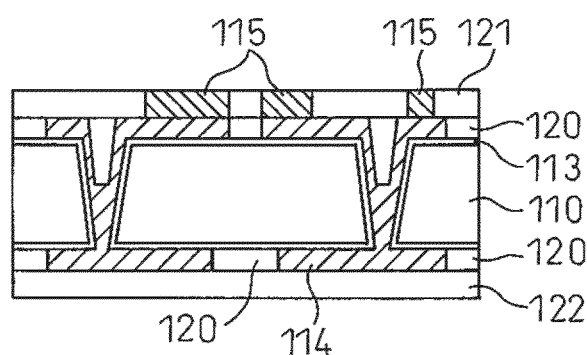

Then, using the resist pattern 121, the conductive posts 115 of Cu are formed on the respective electrodes 114 by electrolytic plating, as shown in FIG. 12(b). The thickness of each conductive post 115 is about 30 μm.

Figure 12C:
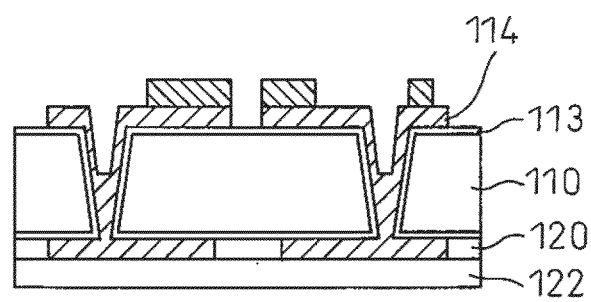

Next, as shown in FIG. 12(c), the resist patterns 120 and 121 formed on the same side as the conductive posts 115 are removed using a prescribed removing material.

Figure 12D:
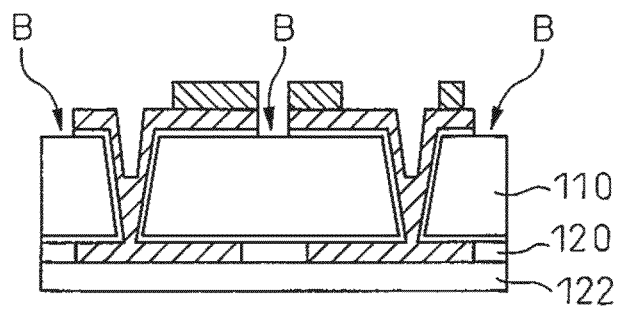

Next, as shown in FIG. 12(d), any portion (indicated at B) of the seed metal layer 113, remaining exposed after the resist patterns 120 and 121 on the upper surface of the substrate 110 have been removed, is removed by etching.

Figure 13A:
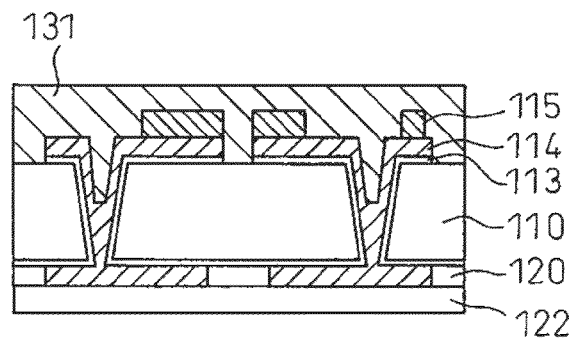
FIGS. 13(a) to 13(d) are diagrams (part 3) for explaining the fabrication process of the LED light source device 5.

Then, as shown in FIG. 13(a), a white ink layer 131 is deposited by screen printing on the same side of the substrate 110 as the conductive posts 115 in such a manner as to completely cover the conductive posts 115 as well as the electrodes 114. Since the thickness of each electrode 114 is 10 to 15 μm, and the thickness of each conductive post 115 is 30 μm, as earlier described, it is preferable to form the white ink layer 131 to a thickness of about 50 μm.

Figure 13B:
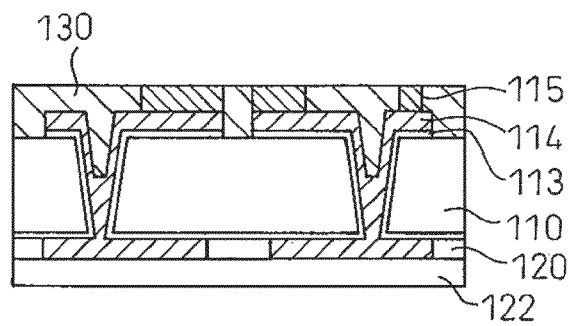

Next, as shown in FIG. 13(b), the upper surface of the white ink layer 131 is ground until the upper surface of each electrode 114 is exposed, to complete the formation of the reflective layer 130. The thickness of the reflective layer 130 is thus set equal to the combined thickness of the electrode 114 and conductive post 115. When the reflective layer is formed using a white ink, a reflectance of 90% or higher can be retained as long as the thickness of the reflective layer 130 is made not smaller than 30 μm.

Figure 13C:
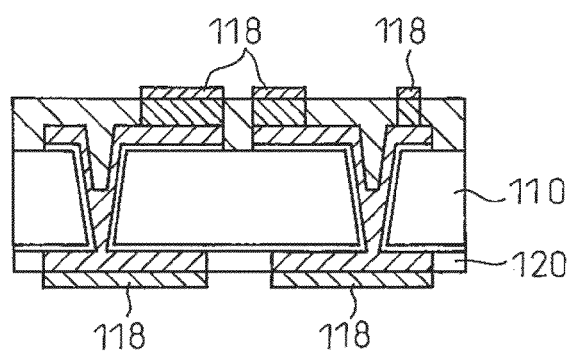

Next, as shown in FIG. 13(c), the masking tape 122 is removed for flip-chip bonding and solder reflow, and the Ni—Au plated layers 118 are formed by electrolytic plating on the conductive posts 115 as well as on the surfaces of the electrodes 114 on the lower side of the substrate 110. As earlier described, the Ni—Au plated layers 118 each have a two-layered structure with a Ni layer formed directly on the electrode 114 or conductive post 115 and an Au layer formed on top of the Ni layer.

Figure 13D:
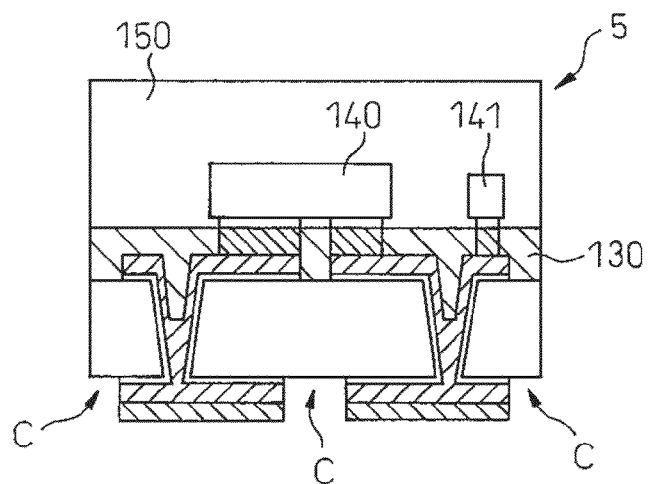

Finally, as shown in FIG. 13(d), the LED element 140 and the zener diode 141 are bonded to the respective conductive posts 115, and the sealing member 150 is formed so as to cover the LED element 140 and the zener diode 141, to complete the fabrication of the LED light source device 5. After the step of FIG. 13(c), the resist pattern 120 remaining on the lower surface of the substrate 110 is removed using a prescribed removing material, and any portion (indicated at C) of the seed metal layer 113, remaining exposed after the resist pattern 120 has been removed, is removed by etching.

A batch manufacturing method is commonly employed in which a plurality of substrates 110 are made by the batch from a large single substrate, i.e., the single substrate is processed through a series of steps from the formation of the through-holes to the formation of the sealing member 150, and the substrate is finally diced into the individual substrates to obtain each individual LED light source device. With such a batch manufacturing method in mind, the fabrication process of the present embodiment has been described step by step for each individual substrate 110. In the batch manufacturing method according to the present embodiment, the seed metal layer 113 is formed as a common electrode for plating so as to completely cover the upper and lower surfaces of the single substrate. However, the common electrode for plating need not be limited to the seed metal. As a well known technique, use may be made of a plating electrode such that, in the single substrate state, the electrodes 114a, 114b, 114c, and 114d of each individual substrate are formed as a single continuously connected electrode and, when the single substrate is diced into the individual substrates, the single electrode is separated into a pair of electrodes 114a, 114c and a pair of electrodes 114b, 114d. This technique eliminates the need for the formation and removal of the seed metal layer 113.

Further, rather than forming the gold-tin eutectic layer as part of each gold bump 119, a gold-tin eutectic layer or a tin layer may be formed on each of the conductive posts 115a, 115b, 115c, and 115d, and the gold bumps 119 may be bonded to the respective conductive posts 115a, 115b, 115c, and 115d by eutectic bonding. Similarly, a silver-tin eutectic layer may be formed on each of the conductive posts 115a, 115b, 115c, and 115d, and the gold bumps 119 each containing a gold-tin eutectic layer may be bonded to the respective conductive posts 115a, 115b, 115c, and 115d by eutectic bonding. In the present embodiment, the Ni—Au plated layers 118a, 118b, 118c, and 118d have been formed by electrolytic plating on the respective conductive posts 115a, 115b, 115c, and 115d, but electroless plating may be used instead of the electrolytic plating.

FIG. 14 is a diagram showing examples of how the electrodes and the conductive posts are arranged in the LED light source device 5.

Figure 14A:
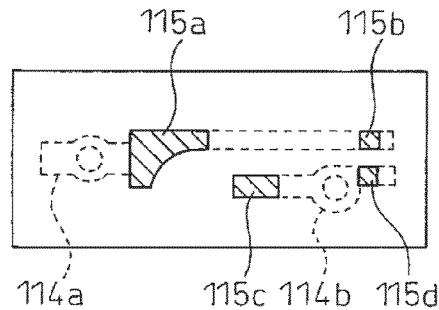
FIGS. 14(a) and 14(b) are diagrams showing examples of how electrodes and conductive posts are arranged in the LED light source device 5.

FIG. 14(a) shows an example of how the electrodes 114a and 114b are arranged on the same side as the conductive posts 115. As shown, the conductive posts 115a and 115b are formed on the electrode 114a, while the conductive posts 115c and 115d are formed on the electrode 114b. The electrodes 114a and 114b are completely covered with the reflective layer 130 except where the conductive posts are formed.

Figure 14B:
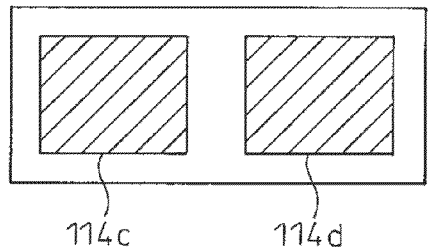

FIG. 14(b) shows an example of how the electrodes 114c and 114d are arranged on the side opposite from the conductive posts 115. As previously described, the electrode 114c is electrically connected to the electrode 114a via the plated-through hole 111, and the electrode 114d is electrically connected to the electrode 114b via the plated-through hole 111. In FIGS. 14(a) and 14(b), the Ni—Au plated layers 118 formed on the electrodes 114 and conductive posts 115 are omitted for convenience of illustration. The geometries of the electrodes and conductive posts shown in FIGS. 14(a) and 14(b) are only examples and not limited to those illustrated here.

Figure 15:
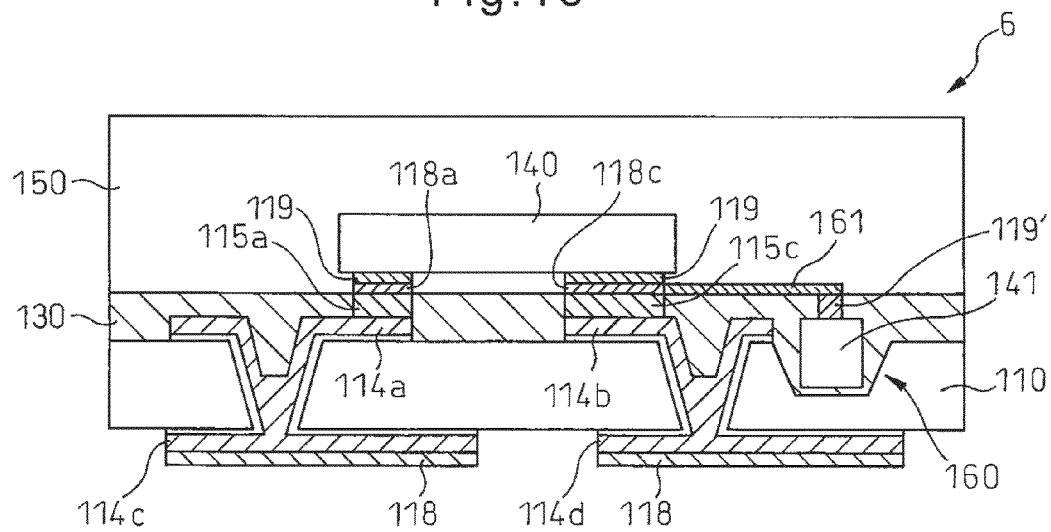
FIG. 15 is a schematic cross-sectional view of a further alternative LED light source device 6.

FIG. 15 is a schematic cross-sectional view of a further alternative LED light source device 6.

The only difference between the LED light source device 6 of FIG. 15 and the LED light source device 5 of FIG. 10 is that, in the LED light source device 6, the zener diode 141 is covered with the reflective layer 130. In other respects, the structure is the same as that of the LED light source device 5 shown in FIG. 10, and will not be further described herein.

As shown in FIG. 15, in the LED light source device 6, a recessed portion 160 is formed in the substrate 110, and the zener diode 141 with a gold bump 119' formed thereon is placed in the recessed portion 160. The zener diode 141 is connected to the underside of an electrode 161 via the gold bump 119'. The electrode 161 is formed by plating on the reflective layer 130, and connects between the gold bump 119' formed on the zener diode 141 and the gold bump 119 formed on the LED element 140. The reflective layer 130 is formed so as to completely cover the electrodes 114 and the zener diode 141, except where the conductive posts 115 and the electrode 161 are formed. The LED element 140 is connected to the conductive posts 115 via the respective gold bumps 119.

In the LED light source device 6 shown in FIG. 15, since only the LED element 140 is exposed above the reflective layer 130, the light emitted from the LED element 140 can be prevented from being absorbed by the zener diode 141. Accordingly, the light source device 6 shown in FIG. 15 has the advantage that the light emitted from the LED element 140 can be utilized more efficiently than the light source device 5 shown in FIG. 10.

Figure 16:
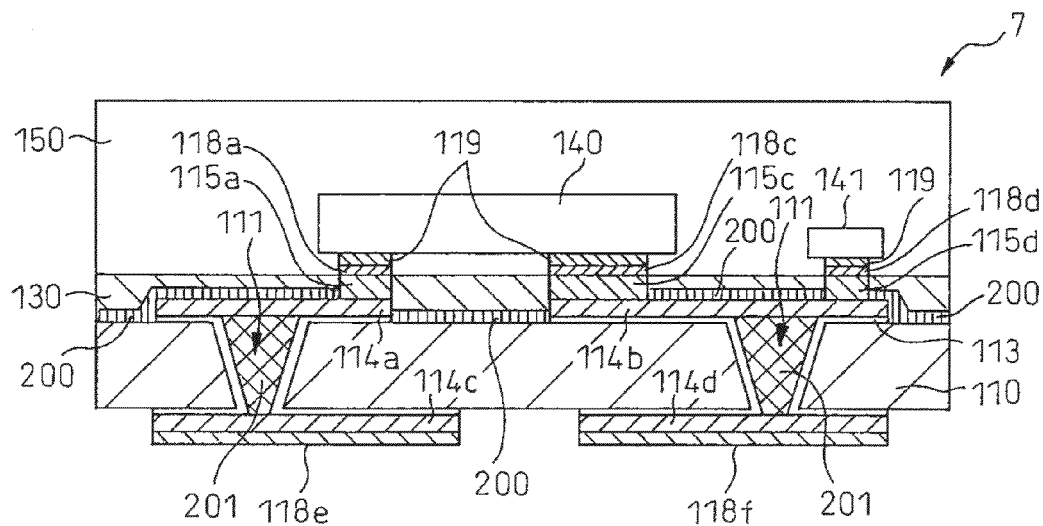
FIG. 16 is a schematic cross-sectional view of a still further alternative LED light source device 7.

FIG. 16 is a schematic cross-sectional view of a still further alternative LED light source device 7.

One difference between the LED light source device 7 of FIG. 16 and the LED light source device 5 of FIG. 10 is that a white organic resist layer 200 is interposed between the substrate 110 and the reflective layer 130 and between the reflective layer 130 and the respective electrodes 114a and 114b. Another difference is that, in the LED light source device 7 of FIG. 16, the undersurface of each of the electrodes 114a and 114b is planar because the underlying plated-through hole 111 is filed with a metal paste 201. In other respects, the structure is the same as that of the LED light source device 5 shown in FIG. 10, and will not be further described herein.

The white organic resist layer 200 is prepared by dispersing fine reflective particles of titanium oxide or the like into an organic binder such as a silicone resin, and is formed to a thickness of 10 to 15 μm. The white organic resist layer 200 is deposited by coating over the entire upper surface of the circuit substrate just before the step of FIG. 13(a). After that, the step of FIG. 13(a) is carried out. That is, the reflective layer 130 is formed by using the white organic resist layer 200 as the base layer.

It is preferable to fill the metal paste 201 into the respective plated-through holes 111 immediately after the seed metal layer 113 has been formed in the step of FIG. 11(c).

When the thickness of the reflective layer 130 formed as the white inorganic resist layer is large, there can occur cases where the reflective layer 130 cracks or delaminates due to the difference in thermal expansion coefficient between the substrate 110 and the reflective layer 130. In the LED light source device 7, the white organic resist layer 200 which is softer than the reflective layer 130 formed as the white inorganic resist layer serves a buffer for the reflective layer 130 and thus prevents the reflective layer 130 from cracking and/or delaminating. Furthermore, since fine reflective particles are also contained in the white organic resist layer 200, the thickness of the reflective layer 130 can be reduced without impairing the reflective effect. On the other hand, the white organic resist layer 200 is protected against degradation due to light, because the light is blocked by the reflective layer 130.

Figure 17:
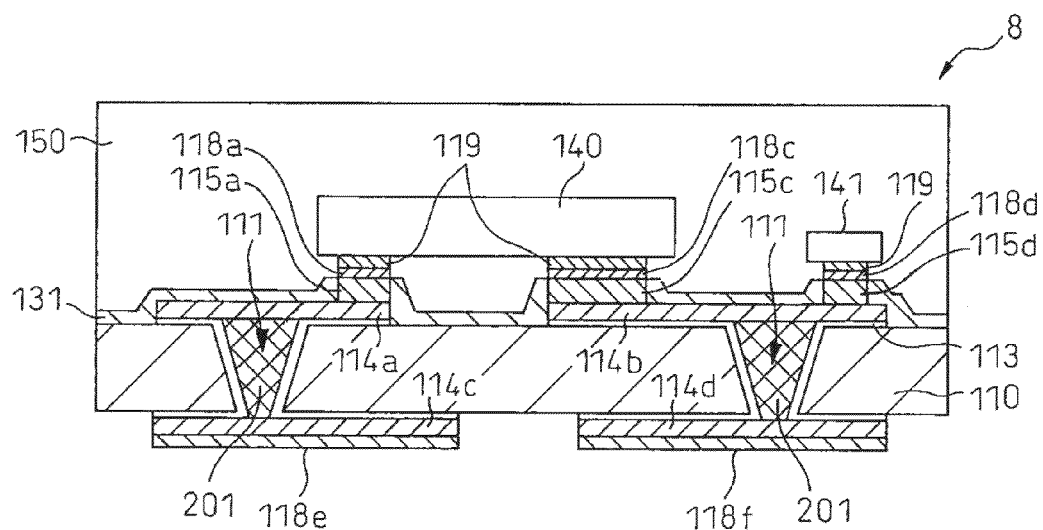
FIG. 17 is a schematic cross-sectional view of a yet further alternative LED light source device 8.

FIG. 17 is a schematic cross-sectional view of a yet further alternative LED light source device 8.

One difference between the LED light source device 8 of FIG. 17 and the LED light source device 5 of FIG. 10 is that the reflective layer 131 is formed thin enough that the shape of each of the conductive posts 115a to 115d can be identified. Another difference is that, in the LED light source device 8 of FIG. 17, the undersurface of each of the electrodes 114a and 114b is planar because the underlying plated-through hole 111 is filed with a metal paste 201. In other respects, the structure is the same as that of the LED light source device 5 shown in FIG. 10, and will not be further described herein.

While the reflective layer 131 is formed thin enough that the shape of each of the conductive posts 115a to 115d can be identified, the portions of the reflective layer 131 that contact the respective conductive posts 115a to 115d are raised so as to be flush with the top surfaces of the respective conductive posts 115a to 115d. The reflective layer 131 is formed in the shape shown in FIG. 17 in the step of FIG. 13(a). The thickness of the reflective film, except the raised portions, is about one-half of the height of the conductive posts 115a to 115d.

It is preferable to fill the metal paste 201 into the respective plated-through holes 111 immediately after the seed metal layer 113 has been formed in the step of FIG. 11(c).

In the LED light source device 8, the raised portions of the reflective film 130 are initially formed higher than the conductive posts 115a to 115d. Thereafter, the raised portions are ground so as to be flush with the top surfaces of the respective conductive posts 115a to 115d. In the LED light source device 5 shown in FIG. 10, the entire surface structure of the substrate has been ground until the reflective layer 131 becomes flush with the top surfaces of the respective conductive posts 115a to 115d. By contrast, in the case of the LED light source device 8, since only the upper portion of and portion around the respective conductive posts 115a to 115d need be ground, the amount of grinding can be reduced.

The reduced thickness of the reflective layer 131 also offers the advantage that the substrate array (an array of circuit substrates made on a single substrate) can be prevented from undulating or warping due to the difference in thermal expansion coefficient between the substrate 110 and the reflective layer 131.

What is claimed is:

1. An LED light source device comprising:
   a substrate;
   an electrode formed on said substrate;
   a conductive post stacked on said electrode;
   an LED element connected to said conductive post,
   wherein a white inorganic resist layer contains fine white inorganic particles dispersed or mixed into an inorganic binder,
   a white organic resist layer interposed between said white inorganic resist layer and said substrate,
   said white inorganic resist layer is deposited over said substrate so as to cover a surface thereof everywhere except where said conductive post is formed, and
   a level of the upper surface of said conductive post is substantially the same as a level of the upper surface of said white inorganic resist.

2. The LED light source device according to claim 1, wherein said conductive post has a columnar structure.

3. The LED light source device according to claim 1, wherein said LED element is flip-chip mounted on said conductive post.

4. The LED light source device according to claim 3, wherein said LED element is connected to said conductive post by gold-tin eutectic bonding.

5. The LED light source device according to claim 1, further comprising a zener diode covered with said white inorganic resist layer and connected to said LED element.

6. The LED light source device according to claim 1, wherein said substrate is a resin substrate.

7. The LED light source device according to claim 1, wherein said substrate is an inorganic substrate.

8. The LED light source device according to claim 1, wherein the surface of said white inorganic resist layer is even.

9. The LED light source device according to claim 1, wherein the surface of said white inorganic resist layer only around said conductive post is even.

10. The LED light source device according to claim 1, wherein an upper surface area of said conductive post is smaller than an upper surface area of said electrode.

* * * * *